US008816725B2

(12) United States Patent
Steeneken et al.

(10) Patent No.: US 8,816,725 B2
(45) Date of Patent: Aug. 26, 2014

(54) HIGH-VOLTAGE ELECTRICAL SWITCH BY SERIES CONNECTED SEMICONDUCTOR SWITCHES

(71) Applicant: NXP B.V., Eindhoven (NL)

(72) Inventors: Peter Gerard Steeneken, Valkenswaard (NL); Arnoud Pieter van der Wel, Vught (NL)

(73) Assignee: NXP B.V., Eindhoven (NL)

( * ) Notice: Subject to any disclaimer, the term of this patent is extended or adjusted under 35 U.S.C. 154(b) by 42 days.

(21) Appl. No.: 13/731,184

(22) Filed: Dec. 31, 2012

(65) Prior Publication Data

US 2014/0184309 A1 Jul. 3, 2014

(51) Int. Cl.
*H03B 1/00* (2006.01)
*H03K 3/00* (2006.01)
*H03K 17/689* (2006.01)

(52) U.S. Cl.
CPC .................................. *H03K 17/689* (2013.01)
USPC ............................ 327/108; 327/109; 327/112

(58) Field of Classification Search
None
See application file for complete search history.

(56) References Cited

U.S. PATENT DOCUMENTS

| 4,357,544 | A | * | 11/1982 | May et al. .................. 307/34 |
| 5,172,290 | A | * | 12/1992 | Leipold et al. ............... 361/56 |
| 5,475,258 | A | * | 12/1995 | Kato et al. .................. 257/603 |
| 5,545,914 | A | * | 8/1996 | Kumano ..................... 257/469 |
| 6,348,716 | B1 | * | 2/2002 | Yun ........................... 257/356 |
| 6,507,088 | B2 | * | 1/2003 | Yoneda ....................... 257/551 |
| 7,729,144 | B2 | * | 6/2010 | Urakabe et al. ............... 363/71 |
| 7,893,521 | B2 | * | 2/2011 | Lunenburg et al. ........... 257/532 |
| 2013/0271187 | A1 | * | 10/2013 | Hayashi et al. .............. 327/109 |

FOREIGN PATENT DOCUMENTS

JP        2003-069406      *   3/2003

OTHER PUBLICATIONS

Zingg, Rene P., "On the Specific On-Resistance of High-Voltage and Power Devices," IEEE Transactions on Electron Devices, vol. 51, No. 3, Mar. 2004, pp. 492-499.

Baek, Ju Won et al., "High-Voltage Switch Using Series-connected IGBTs With Simple Auxiliary Circuit," IEEE Transactions on Industry Applications, vol. 37, No. 6, Nov./Dec. 2001, pp. 1832-1839.

Hess, Herbert L., "Transformerless Capacitive Coupling of Gate Signals for series Operation of Power MOS Devices," IEEE Transactions on Power Electronics, vol. 15, No. 5, Sep. 2000, pp. 923-930.

* cited by examiner

Primary Examiner — Tuan T Lam (57) ABSTRACT

A high voltage electrical switch including: a plurality of series connected semiconductor switches; a plurality of rectifiers wherein each rectifier is connected to a semiconductor switch control input of one of the semiconductor switches; a radio frequency signal generator; and a plurality of galvanic isolators, wherein each galvanic isolator connects the radio frequency signal generator to one of the plurality of rectifiers, wherein the plurality of semiconductor switches are isolated from one another.

20 Claims, 6 Drawing Sheets

HIGH-VOLTAGE ELECTRICAL SWITCH BY SERIES CONNECTED SEMICONDUCTOR SWITCHES

TECHNICAL FIELD

Various exemplary embodiments disclosed herein relate generally to high-voltage electrical semiconductor switches.

BACKGROUND

There are many high voltage electrical systems that require switching. These systems may switch voltages that are much higher than typical logic and control circuitry voltages and may include 20V, 50V, 100V, 200V, or even higher voltages. Semiconductor switches are often used to provide power switching to such electrical systems. These semiconductor switches need to be designed to accommodate the voltages needed in the electrical system. These semiconductor switches may have an on resistance $R_{on}$ and a breakdown voltage BV.

High-voltage MOS transistors that may be made in a certain semiconductor processes obey the relationship:

$$R_{on}A = BV \qquad (1)$$

$R_{on}$ is the transistor's resistance in the on-state, which should be as small as possible. A is the transistor's area, is a constant that depends on the process and geometry details of the transistor, and BV is the breakdown voltage of the transistor, which should be as large as possible. For example, for a vertical transistor (VDMOS), =2.5, and for optimal lateral transistors (LDMOS), =2.33. (See Zing, ON THE SPECIFIC ON-RESISTANCE OF HIGH-VOLTAGE AND POWER DEVICES, IEEE Trans. El. Dev. p. 492, 2004). Accordingly a lower value of is desirable if a low $R_{on}A$ product is desired at a given breakdown voltage.

This relationship demonstrates two issues with semiconductor switches. First, transistors with a large breakdown voltage BV require a large area. Doubling the breakdown voltage while keeping $R_{on}$ the same requires an area that is 5-5.7 times larger for the transistor. This larger area increases the size and the cost of the semiconductor switch.

Second, each desired transistor breakdown voltage requires a specific transistor optimization in terms of length of the drift region, doping profile, and gate location. Accordingly, this requires that a range of different transistors sizes need to be developed, e.g., 20V, 60V and 100V transistors. Each of these transistors needs to be designed, qualified and modeled. Because the spacing between available voltages is large, suboptimal may designs result. For example if only 20V, 60V, and 100V transistors are available for a 30V application, the 60V transistor will be used by the designers, thus requiring an area 5 times larger than a dedicated 30V transistor would yield.

Third, breakdown voltages beyond what is offered by the technology are not possible. For example, an application requiring 150V or 200V breakdown voltage may not be possible or the transistor area and cost required are prohibitive.

SUMMARY

A brief summary of various exemplary embodiments is presented below. Some simplifications and omissions may be made in the following summary, which is intended to highlight and introduce some aspects of the various exemplary embodiments, but not to limit the scope of the invention. Detailed descriptions of an exemplary embodiment adequate to allow those of ordinary skill in the art to make and use the inventive concepts will follow in later sections.

Various exemplary embodiments relate to a high voltage electrical switch including: a plurality of series connected semiconductor switches; a plurality of rectifiers wherein each rectifier is connected to a semiconductor switch control input of one of the semiconductor switches; a radio frequency signal generator; and a plurality of galvanic isolators, wherein each galvanic isolator connects the radio frequency signal generator to one of the plurality of rectifiers, wherein the bodies of the plurality of semiconductor switches are isolated from one another.

Further, various exemplary embodiments relate to a high voltage electrical switch including: a first plurality of semiconductor switches; a first plurality of rectifiers wherein each rectifier is connected to a semiconductor switch control input of one of the semiconductor switches; a radio frequency signal generator; and a first plurality of galvanic isolators, wherein each galvanic isolator connects the radio frequency signal generator to one of the plurality of rectifiers; a second plurality of semiconductor switches; a second plurality of rectifiers wherein each rectifier is connected to a semiconductor switch control input of one of the semiconductor switches; a second plurality of galvanic isolators, wherein each galvanic isolator connects the radio frequency signal generator to one of the plurality of rectifiers, wherein the plurality of semiconductor switches are isolated from one another, wherein the first plurality of rectifiers and first plurality of galvanic isolators are configured to turn the semiconductor switches on, and wherein the second plurality of rectifiers and second plurality of galvanic isolators are configured to turn the semiconductor switches off.

BRIEF DESCRIPTION OF THE DRAWINGS

In order to better understand various exemplary embodiments, reference is made to the accompanying drawings, wherein.

To facilitate understanding, identical reference numerals have been used to designate elements having substantially the same or similar structure and/or substantially the same or similar function.

DETAILED DESCRIPTION

Figure 1:
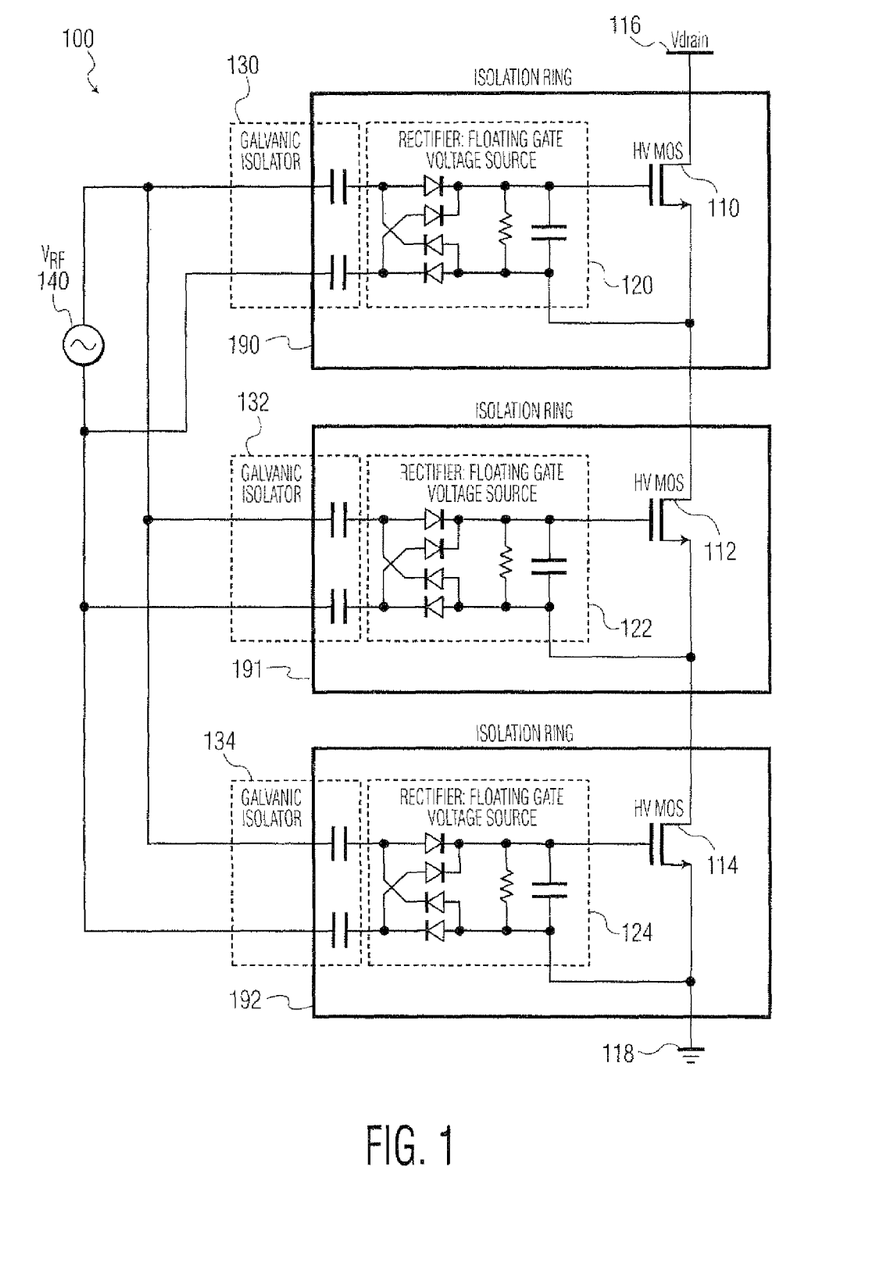
FIG. 1 illustrates an embodiment of a high voltage switch using isolated series connected semiconductor switches.

FIG. 1 illustrates an embodiment of a high voltage switch using isolated series connected semiconductor switches. A number N of semiconductor switches, for example MOS transistors, may be connected in series (by way of non-limiting example, FIG. 1, as well as FIGS. 2-6, depicts three MOS transistors, meaning N=3, and it will be understood that, with regard to each embodiment, different numbers of such transistors could be provided). The total drain voltage may be distributed over the semiconductor switches, such that the total breakdown voltage BV that the combination of semiconductor switches can withstand may be approximately a factor N higher than the breakdown voltage of a single semiconductor switch. Each semiconductor switch may be placed in an electrically isolated island surrounded (laterally and/or vertically) by an isolation trench. The isolation trench may be filled with a dielectric insulating material. Alternatively, each semiconductor switch may be placed in an electrically isolated island surrounded by junction isolation regions. The junction isolation regions may include semiconducting material with different doping types that may block currents just like a reverse biased diode. It is noted that although the trenches isolate the bodies of the semiconductor switches, their source and drain terminals may still be connected to conduct current outside of each voltage island. The semiconductor switch may be switched using a gate-source voltage that is provided by a local floating voltage source. Each of the floating voltage sources may be powered by an RF signal that may be coupled through a galvanic isolator. By switching the RF source on and off, the gate drive, and thereby the semiconductor switch may be switched on and off. The high voltage switch 100 may be manufactured as a single integrated circuit (IC). An integrated circuit is an electronic circuit on one small substrate ("chip") of semiconductor material, normally silicon. In some embodiments, portions of the high voltage switch 100 may be separate from the IC, for example the RF voltage source 140.

The high voltage switch 100 may include semiconductor switches 110, 112, 114, rectifiers 120, 122, 124, galvanic isolators 130, 132, 134, an RF voltage source 140, and isolation trenches 190, 191, 192. The semiconductor switches 110, 112, 114 may be connected in series between a drain voltage $V_{drain}$ 116 and ground 118.

The semiconductor switch 110 may be connected to the rectifier 120. The rectifier 120 may be connected to the galvanic isolator 130. The RF voltage source 140 may be connected to the galvanic isolator 130. The isolation trench 190 may isolate the semiconductor switch 110, the rectifier 120, and the galvanic isolator 130 from other electrical components. The isolation trench 190 may be formed using a dielectric insulating material or using junction isolation regions as described above. The RF voltage source 140 may produce an RF power signal. The galvanic isolator 130 may receive the RF power signal and provide it to the rectifier 120. The rectifier 120 may convert the RF power signal into a DC gate drive signal used to drive the gate of the semiconductor switch 110. The driving circuit arrangement may be the same for each of the semiconductor switches 110, 112, 114. As a result, turning the RF voltage source 140 on and off may turn the semiconductor switches 110, 112, 114 on and off.

The galvanic isolators 130, 132, 134 are shown as capacitors in FIG. 1, but other types of galvanic isolators may be used as well. A capacitive galvanic isolator 130 may use a capacitor to couple the RF power signal across the isolation trench 190. The characteristics of the capacitor may be selected in order to effectively couple the RF power signal across the isolation trench 190. Other types of galvanic isolators may include for example, optical or inductive isolators. An optical isolator may be an optocoupler. An optical isolator may include an optical transmitter, optical receiver, and optical transmission channel. The optical transmitter may receive the RF power signal and produce an optical signal that then may be transmitted to the optical receiver via the optical transmission channel. The optical receiver may then demodulate the optical signal to reproduce the RF power signal that may then be applied to the rectifier 120. An inductive isolator may be a transformer. An inductive isolator may include windings sharing a core. The inductive isolator may receive the RF power signal on input windings and inductively couple the RF power signal to output winding to reproduce the RF power signal that may then be applied to the rectifier 120. Galvanic isolators 132 and 134 may be designed in like manner.

The rectifiers 120, 122, 124 may receive and rectify the RF power signal to produce a DC gate drive signal to drive the gate of the semiconductor switches 110, 112, 114. Any type of rectifier may be used. The rectifier may produce a floating gate voltage source.

The semiconductor switches 110, 112, 114 may be transistors or other semiconductor devices having a semiconductor switch control input. Examples of transistors for use as a semiconductor may include, for example, NMOS and PMOS MOS field-effect transistors as well as other known types of semiconductor transistors and switches. For field-effect transistors the semiconductor switch control input may be a gate as is described above and below.

The isolation trenches 190, 191, 192 may include an opening in the semiconductor substrate of the IC with an isolating material filling the trench. The isolation trenches may be formed in any manner and in various configurations. The isolations trenches 190, 191, 192 may provide electrical isolation to the semiconductor switches 110, 112, 114 and the associated drive circuitry. By way of example and not limitation, isolation trenches such as those described in U.S. patent application Ser. No. 13/705,627, entitled "INTEGRATED CIRCUITS SEPARATED BY THROUGH-WAFER TRENCH ISOLATION" may be used as the isolation trenches described herein. Further, U.S. patent application Ser. No. 13/705,627 is incorporated by reference herein for all purposes.

In an example of a specific implementation, the semiconductor switches may be NMOS LDMOS transistors in a silicon on insulator (SOI) process like ABCD9 with BV=20V. The isolation trench may be a medium trench isolation (MTI) oxide ring that may withstand 200V. $V_{RF}$ may be an RF signal at 800 MHz with an amplitude of 3.3 V. The galvanic isolator may include isolator capacitors that may be backend capacitors with a breakdown voltage higher than 200V. Each rectifier may include one or more rectifying elements such as diodes or MOSFETs and one or more capacitors.

Depending on the total switch breakdown voltage $BV_T$ needed by the designer, the individual breakdown voltages BV of stages of the series combination may be chosen in steps of BV, e.g., 10V or 20V (by way of non-limiting example, if the desired $BV_T$ is 40V, two stages having breakdown voltages of 20V each, or a 20V stage plus two 10V stages could be provided). Further, the designer may have available a number of different stages with different BVs to use, e.g., 10V, 20V, and 50V. Different combinations of these stages may be developed and then combined to provide fine tuning in the resulting breakdown voltage BV of the high voltage switch 100. By way of non-limiting example, using three stages with BVs of 10V, 20V and 50V, respectively, results in a switch having a $BV_T$ of 80V.

Figure 2:
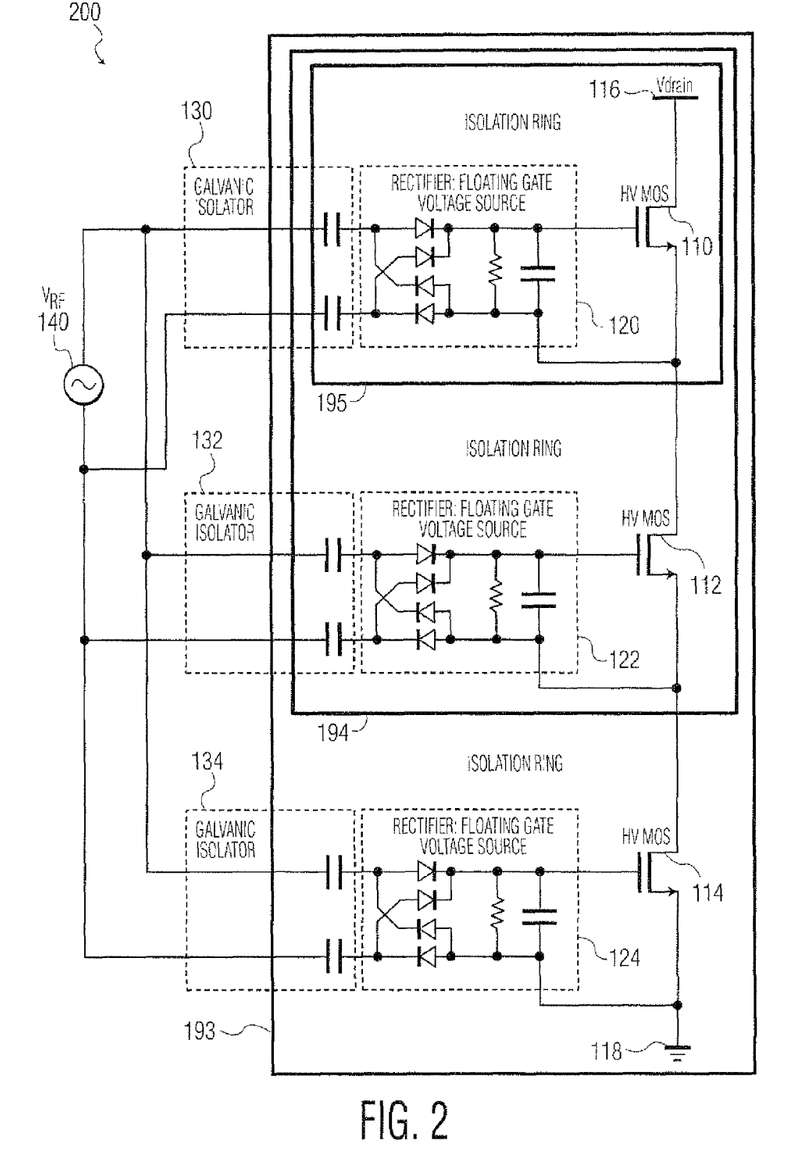
FIG. 2 illustrates another embodiment of a high voltage switch using isolated series connected semiconductor switches including nested isolation trenches.

FIG. 2 illustrates another embodiment of a high voltage switch using isolated series connected semiconductor switches including nested isolation trenches. The high voltage switch 200 in FIG. 2 is generally the same as the high power switch 100 in FIG. 1 except for a different configuration of the isolation trenches 193, 194, 195, and so only the relevant differences will be discussed. The isolation trenches 193, 194, 195 may be nested as shown. For example the isolation trench 195 may only surround the first stage including semiconductor switch 112. The second trench 194 may surround the first and second stages including the semiconductor switches 112, 114. The second trench 194 may also surround the first trench 195. Finally, the third trench 193 may surround the first, second, and third stages including the semiconductor switches 112, 114, 116. The third trench 193 may also surround the first trench 195 and the second trench 194. In this embodiment, the semiconductor switch 110 may be the highest voltage switch so that it has the most isolation by residing within all three isolation trenches 193, 194, 195. The semiconductor switch 112 may be the next highest voltage switch so that it resides within two isolation trenches. Finally, the semiconductor switch 114 may be the lowest voltage switch so that is resides only in one isolation trench. Multiple semiconductor switches may also share an isolation trench. Various combinations of switches and nesting may be implemented according to this embodiment and the desired application.

Figure 3:
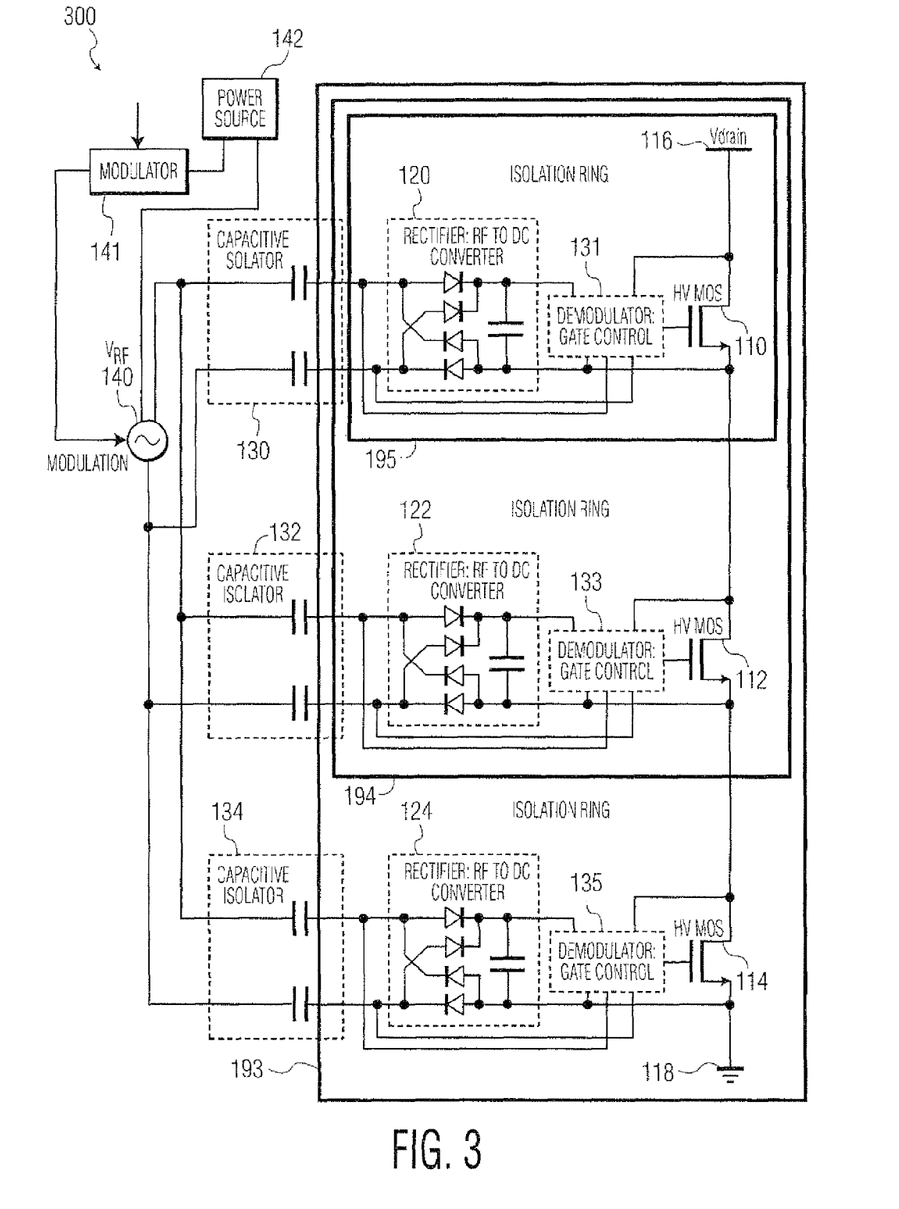
FIG. 3 illustrates another embodiment of a high voltage switch including gate control modulation.

FIG. 3 illustrates another embodiment of a high voltage switch including gate control modulation. The high voltage switch 300 in FIG. 3 is the same as high power switch 200 in FIG. 2 except for the addition of gate control modulation, and so only the relevant differences will be discussed. The high voltage switch 300 further may include modulator 141, power source 142, and demodulators 131, 133, 135. The modulator 141 may provide an arbitrary switching input control signal that may be modulated on to the RF power source 140. The power source 140 may provide power to drive the modulator 141 and the RF power source 140.

The modulated RF power signal may be applied to each galvanic isolator as follows. The modulated RF power signal from RF power source 140 may be received by a demodulator 131, 133, 135 that may detect the modulated RF power signal before the rectifier. Then the rectifier may generate a DC voltage from the remaining RF signal that may be used to power the demodulator 131, 133, 135. The demodulator 131, 133, 135 may generate a gate drive signal that depends on the received modulated RF signal. The type of modulation may include, for example, phase-modulation, frequency-modulation or amplitude-modulation or a combination of these. The control of the gate drive signal by the demodulator may be an on-off type switching, but the gate voltage may also be regulated continuously. This continuous control may be advantageous in high-voltage amplifier applications where a small control voltage may be used to regulate very high voltages.

Further, the demodulator 131, 133, 135 may include a sensing circuit (not shown) that detects the source-drain voltage $V_{sd}$ and the source-gate voltage $V_{gs}$ and then adjusts the gate voltage such that neither $V_{sd}$ and $V_{gs}$ exceeds the break down limits of the semiconductor switches. Accordingly, the demodulator 131, 133, 135 may be connected to the drain of the semiconductor switches.

Another embodiment of a high power switch may include two control channels to drive the semiconductor switch (not shown). Such an arrangement may include the use of two galvanic isolators and two rectifiers per semiconductor switch. In the case where a modulator 141 is used to modulate the RF power source 140, each control channel may also include two demodulators. One control channel may turn the semiconductor switch on, and the other control channel may turn the semiconductor switch off. This embodiment may improve the switching speed of the high power switch at the expense of additional space on the IC and the associated cost and complexity.

When implementing the high power switch as describe above, a problem may occur when the voltage across the complete series of semiconductor switches becomes unequally distributed among the semiconductor switches. In order to ensure an equal distribution across the transistors the following solutions may be implemented as shown in FIGS. 4-6.

Figure 4:
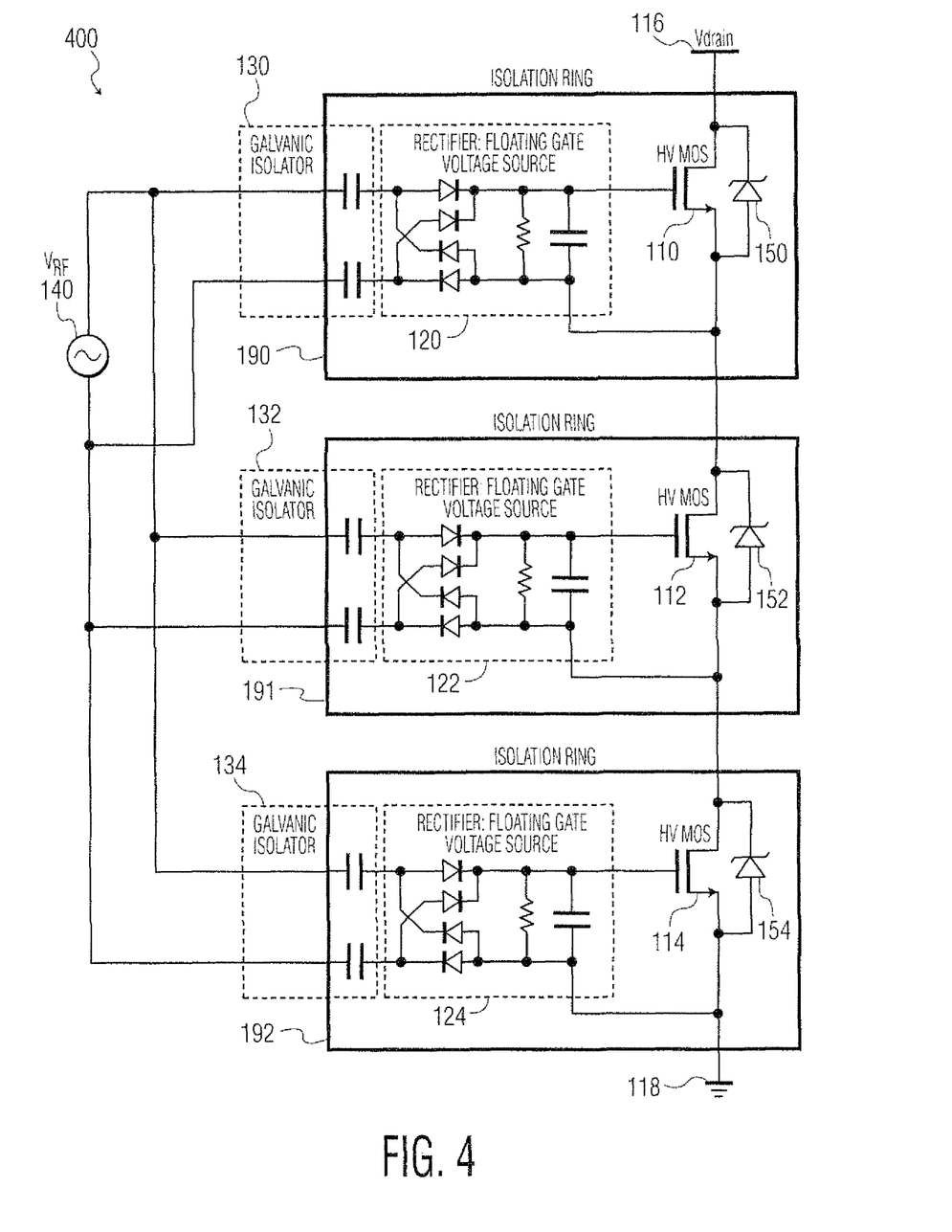
FIG. 4 illustrates another embodiment of a high voltage switch using isolated series connected semiconductor switches including a series diode.

FIG. 4 illustrates another embodiment of a high voltage switch using isolated series connected semiconductor switches each including a series diode. The power switch 400 may be the same as the power switch 100 in FIG. 1 with the addition of diodes 150, 152, 154 connected between the source and drain of the semiconductor switches 110, 112, 114. The diodes may be Zener diodes. The breakdown voltage of the diodes 110, 112, 114 may be slightly lower than the breakdown voltage of the semiconductor switch. When the voltage across the diode becomes too high, such as when the voltage is not substantially equal across the semiconductor switches, the diode turns on to allow current to flow in order to reduce the voltage drop across the associated semiconductor switch. Thus the operation of the diodes may cause the voltage across the semiconductor switches to substantially equalize, and protects the individual switches 110, 112, 114.

Figure 5:
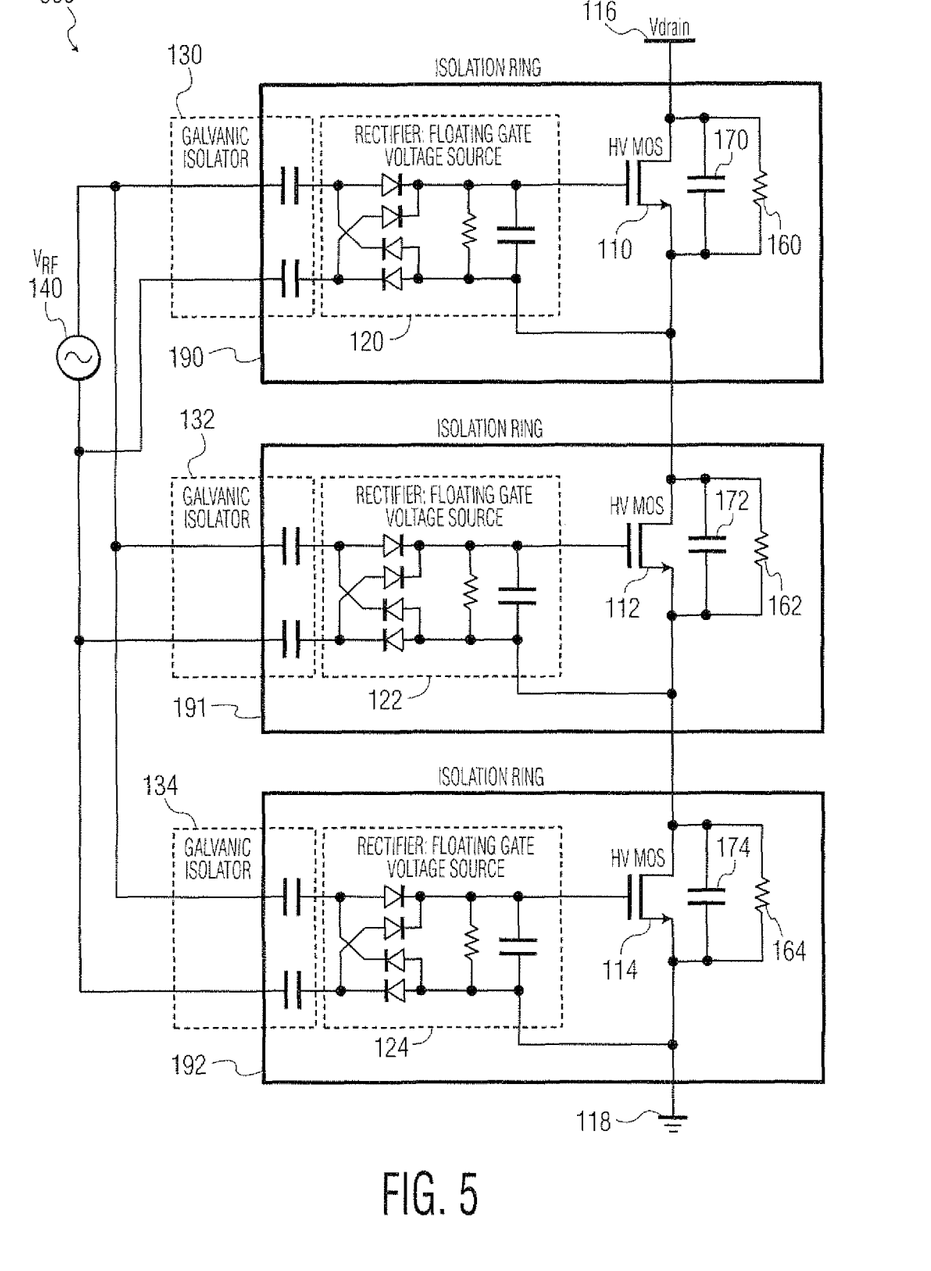
FIG. 5 illustrates another embodiment of a high voltage switch using isolated series connected semiconductor switches including a series resistor and capacitor.

FIG. 5 illustrates another embodiment of a high voltage switch using isolated series connected semiconductor switches each including a series resistor and capacitor. Such a high power switch is suited for providing both DC and AC switching. The power switch 500 may be substantially the same as the power switch 100 in FIG. 1 with the addition of resisters 160, 162, 164 and capacitors 170, 172, 174 respectively connected in parallel between the source and drain of the semiconductor switches 110, 112, 114. Alternatively, only resistors 160, 162, 164 may present (which would be comparable to the FIG. 4 embodiment), or only capacitors 170, 172, 174 may be present. The resistors 160, 162, 164 may have large resistances to minimize the current flow through the resistors 160, 162, 164. Further, the resistors 160, 162, 164 may act as a voltage divider that may equalize the voltages across the semiconductor switches 110, 112, 114, in the same manner as the FIG. 4 embodiment. The resistors 160, 162, 164 may especially be used in DC power applications. The capacitors 170, 172, 174 may have large capacitances to minimize the current flow through the capacitors 170, 172, 174. Further, the capacitors 170, 172, 174 may act as a capacitive voltage divider that may equalize the voltages across the semiconductor switches 110, 112, 114. The capacitors 170, 172, 174 may especially be used in AC power applications.

Figure 6:
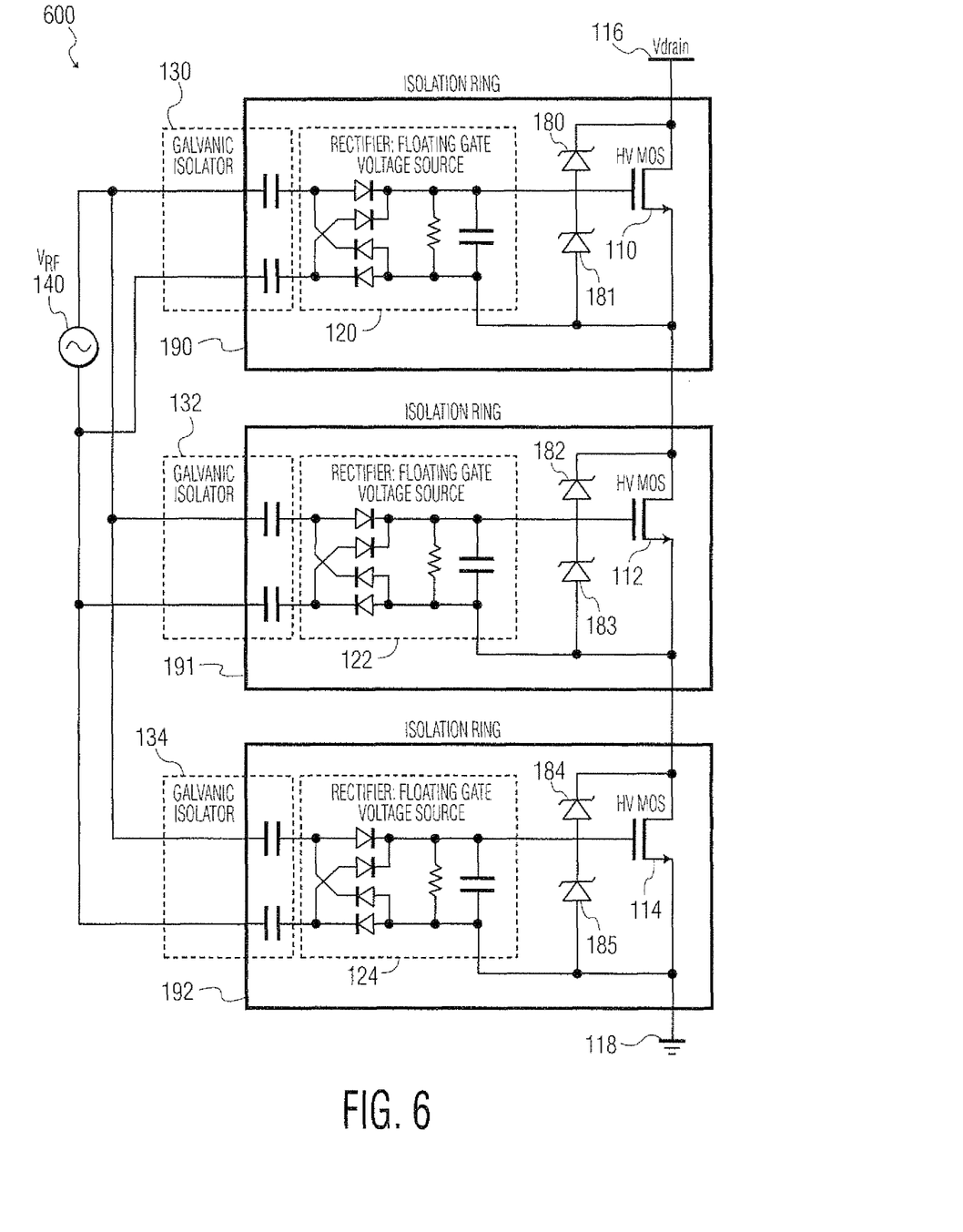
FIG. 6 illustrates another embodiment of a high voltage switch using isolated series connected semiconductor switches including diodes.

FIG. 6 illustrates another embodiment of a high voltage switch using isolated series connected semiconductor switches including diodes. A first diode 180, 182, 184 may be connected respectively between the drain and the gate of semiconductor switches 110, 112, 114. Further, a second diode 181, 183, 185 may be connected respectively between the gate and the source of the semiconductor switches 110, 112, 114. The diodes may be Zener diodes. By way of example only, and not limitation, the first diode 181 between the drain and gate of switch 110 may start to conduct when $V_{dg} > BV - V_{gate}$, where $V_{gate}$ is the nominal voltage needed to switch the transistor switch 110 on and where $V_{dg}$ is the voltage between the drain and the gate of that transistor. Thus the transistor 110 may start to conduct if the voltage is unequally distributed because the gate turns on until it is evenly distributed. The second diode 191, 193, 195 respectively arranged between the gate and source of each of the semiconductor switches 110, 112, 114 may protect the gate voltage from increasing to a value which could cause breakdown of the gate oxide.

The embodiments described above provide various advantages over previous high power switches. First, the above embodiments may provide greater flexibility in designing high power switches, because the designer can assemble a high voltage switch from a number of standardized sub-elements. With one type of semiconductor switch with a breakdown voltage $BV_1$, circuits with any breakdown voltage $BV_n = n*BV_1$ may be constructed as long as $BV_n$ is below the breakdown voltage of the associated isolating ring and capacitive isolator. More values of $BV_n$ may be addressed without the need for designing and qualifying many types of transistors. Further, a small number of semiconductor switches with different BV's may also be used in combination to achieve the desired $BV_n$.

Another advantage may be that the use of a plurality of semiconductor switches in series may lead to smaller IC sizes. For example, in order to create a low enough on-resistance, the semiconductor switch may consume most of the area of the isolated area inside the isolated trench. The local RF voltage source may be relatively compact. In determining the area of the IC to implement the high power switch, area of the RF power source may be neglected, and then the relation between BV and $R_{on}$ for the series combination is:

$$R_{on,n} = n*R_{on,1}$$

$$BV_n = n*BV_1$$

$$A_n = n*A_1$$

So $R_{on,n} A_n = n^2 R_{on,1} A_1$.

Thus for a series combination of semiconductor switches the resulting area may be a factor of n smaller, than for a single transistor in the same technology, to achieve the same BV and $R_{on}$.

It should be appreciated by those skilled in the art that any block diagrams herein represent conceptual views of illustrative circuitry embodying the principles of the invention.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be effected while remaining within the spirit and scope of the invention. Accordingly, the foregoing disclosure, description, and figures are for illustrative purposes only and do not in any way limit the invention, which is defined only by the claims.

What is claimed is:

1. A high voltage electrical switch comprising:
a plurality of semiconductor switches that are connected in series;
a plurality of rectifiers, wherein each rectifier is connected to a semiconductor switch control input of a corresponding one of the semiconductor switches;
a radio frequency signal generator;
a plurality of galvanic isolators, wherein each galvanic isolator connects the radio frequency signal generator to a corresponding one of the plurality of rectifiers and the plurality of semiconductor switches are isolated from one another;
and a plurality of isolation trenches, wherein each isolation trench surrounds at least one of the semiconductor switches.

2. The high voltage electrical switch of claim 1, wherein the semiconductor switches include respective transistors, and a source terminal of at least one of the respective transistors is connected to a drain terminal of another said transistor.

3. The high voltage electrical switch of claim 1, wherein each galvanic isolator is one of a capacitive isolator, an inductive isolator, and an optical isolator.

4. The high voltage electrical switch of claim 1, wherein each semiconductor switch has a substantially identical breakdown voltage.

5. The high voltage electrical switch of claim 1, wherein at least two of the semiconductor switches have different breakdown voltages.

6. The high voltage electrical switch of claim 1, further comprising:
a plurality of resistors, wherein each resistor is connected in parallel to one of the plurality of semiconductor switches.

7. The high voltage electrical switch of claim 5, further comprising:
a plurality of capacitors, wherein each capacitor is connected in parallel to one of the plurality of semiconductor switches.

8. The high voltage electrical switch of claim 1, further comprising:
a plurality of capacitors, wherein each capacitor is connected in parallel to one of the plurality of semiconductor switches.

9. The high voltage electrical switch of claim 1, further comprising:
a plurality of diodes, wherein each diode is connected in parallel to one of the plurality of semiconductor switches.

10. The high voltage electrical switch of claim 1, wherein the plurality of isolation trenches are a plurality of junction isolation regions.

11. The high voltage electrical switch of claim 1, wherein the isolation trenches are nested.

12. The high voltage electrical switch of claim 1, wherein the isolation trenches extend from a top to a bottom of a substrate.

13. The high voltage electrical switch of claim 11, wherein a semiconductor switch with a highest source-drain voltage is disposed within an innermost isolation trench.

14. The high voltage electrical switch of claim 2, further comprising:
a plurality of first diodes, wherein each first diode is connected between a drain and a gate of an associated semiconductor switch; and
a plurality of second diodes, wherein each second diode is connected between a source and a gate of the associated semiconductor switch.

15. The high voltage electrical switch of claim 1, further comprising:
a modulator connected to the radio frequency generator; and
a plurality of demodulators, wherein each demodulator is connected to an input of an associated rectifier.

16. The high voltage electrical switch of claim 15, wherein the plurality of semiconductor switches are transistors, each with a source, a gate, and a drain, and the demodulators each further include a sensing circuit that is configured to detect a source-drain voltage and a source-gate voltage of an associated semiconductor switch and adjust the associated gate voltage such that neither the associated source-drain voltage nor the associated source-gate voltage exceeds a breakdown limit of the associated semiconductor switch.

17. The high voltage electrical switch of claim 1, wherein the plurality of semiconductor switches, the plurality of rectifiers, and the plurality of galvanic isolators are all on a single integrated circuit.

18. The high voltage electrical switch of claim 11, wherein the nested isolation trenches provide increased isolation in proportion to a depth of nesting within the nested isolation trenches.

19. The high voltage electrical switch of claim 11, wherein a second isolation trench surrounds a first isolation trench, and a third isolation trench surrounds both the first isolation trench and the second isolation trench.

20. A high voltage electrical switch comprising:
a first plurality of semiconductor switches;
a first plurality of rectifiers, wherein each rectifier is connected to a semiconductor switch control input of one of the first plurality of semiconductor switches;
a radio frequency signal generator; and
a first plurality of galvanic isolators, wherein each galvanic isolator connects the radio frequency signal generator to a one of the first plurality of rectifiers;

a second plurality of semiconductor switches;
a second plurality of rectifiers, wherein each rectifier is connected to a semiconductor switch control input of one of the second plurality of semiconductor switches;
a second plurality of galvanic isolators, wherein each galvanic isolator connects the radio frequency signal generator to a one of the second plurality of rectifiers, wherein the first and second plurality of semiconductor switches are isolated from one another, the first plurality of rectifiers and first plurality of galvanic isolators are configured to turn the first and second plurality of semiconductor switches on, and the second plurality of rectifiers and second plurality of galvanic isolators are configured to turn the first and second plurality of the semiconductor switches off; and
a plurality of isolation trenches, wherein each isolation trench surrounds at least one of the first and second plurality of semiconductor switches.

* * * * *